(12) United States Patent
Anderson

(10) Patent No.: US 11,169,532 B2
(45) Date of Patent: Nov. 9, 2021

(54) COMPUTER-ASSISTED (CA)/AUTONOMOUS DRIVING (AD) VEHICLE INFERENCE MODEL CREATION

(71) Applicant: Intel Corporation, Santa Clara, CA (US)

(72) Inventor: Glen J. Anderson, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 259 days.

(21) Appl. No.: 16/365,303

(22) Filed: Mar. 26, 2019

(65) Prior Publication Data

US 2019/0220028 A1 Jul. 18, 2019

(51) Int. Cl.
| | |
|---|---|
| *G05D 1/00* | (2006.01) |
| *G05D 1/02* | (2020.01) |
| *G06N 5/00* | (2006.01) |
| *G06N 5/02* | (2006.01) |
| *B60W 40/00* | (2006.01) |
| *B60W 40/09* | (2012.01) |
| *G06N 20/00* | (2019.01) |
| *G06F 30/20* | (2020.01) |
| *G06F 30/15* | (2020.01) |

(52) U.S. Cl.
CPC ........... *G05D 1/0221* (2013.01); *B60W 40/09* (2013.01); *G06F 30/20* (2020.01); *G06N 5/022* (2013.01); *G06N 20/00* (2019.01); *G06F 30/15* (2020.01)

(58) Field of Classification Search
CPC ........ G05D 1/0221; G05D 1/00; G06F 30/20; G06F 30/15; G06F 30/33; G06F 2111/02; B60W 40/09; G06N 20/00; G06N 5/022; G06N 3/0445; G06N 3/0481; G06N 3/0454; G06N 3/08; G06N 5/00; G06N 5/04; G06N 3/006; G08G 1/16; G01C 21/26; G01C 21/32; G01C 21/34
See application file for complete search history.

(56) References Cited

U.S. PATENT DOCUMENTS

| 10,819,923 | B1* | 10/2020 | McCauley | ......... G06K 9/00791 |
| 2019/0303759 | A1* | 10/2019 | Farabet | ................ G06K 9/4628 |
| 2020/0026289 | A1* | 1/2020 | Alvarez | ................. G06N 20/00 |
| 2020/0250456 | A1* | 8/2020 | Wang | ................. G06K 9/00791 |

(Continued)

OTHER PUBLICATIONS

Chris Taylor, "Google's Driverless Car Is Now Safer Than the Average Driver", Aug. 7, 2012, 9 pages [retrieved Jul. 15, 2019], Retrieved from the Internet: <URL: http://www.mashable.com/2012/08/07/google-driverless-cars-safer-than-you/#Ux3P7RNplgq3>.

(Continued)

*Primary Examiner* — Yonel Beaulieu
(74) *Attorney, Agent, or Firm* — Schwabe, Williamson & Wyatt, P.C.

(57) ABSTRACT

Systems, apparatuses, and methods are disclosed for generating an inference model and improving its performance on identified problem locations. Data collected by one or more data sources, such as vehicles, stationary sources, and external or online sources, is used to create an initial inference model, which is then used in an autonomous driving simulator along with the collected data and human driver responses to identify at least one problem location. One or more additional categories of data are identified and collected. The additional category data is then used to create a second inference model.

21 Claims, 8 Drawing Sheets

(56) References Cited

U.S. PATENT DOCUMENTS

2020/0272899 A1* 8/2020 Dunne ................. G06N 3/08
2020/0298401 A1* 9/2020 Cristache ............ B25J 9/1602
2020/0302301 A1* 9/2020 Anderson ............. G06N 3/08
2020/0410288 A1* 12/2020 Capota ............... G06F 9/5072
2021/0034679 A1* 2/2021 Cristache .......... G06F 16/90332

OTHER PUBLICATIONS

Ernest Worthman, "Autonomous vehicles have arrived?", Apr. 14, 2017, 3 pages [retrieved Jul. 15, 2019], Retrieved from Internet: <URL: http://www.linkedin.com/pulse/autonomous-vehicles-have-arrived-ernest-worthman/>.

Mariusz Bojarski et al., "Explaining How End-to-End Deep Learning Steers a Self-Driving Car", May 23, 2017, 8 pages [retrieved on Jul. 15, 2019], Retrieved from Internet: <URL: http://www.devblogs.nvidia.com/explaining-deep-learning-self-driving-car/>.

N. Srivastava et al., "Multimodal Learning with Deep Boltzmann Machines", 2012, 9 pages.

Yu Zheng, "Methodologies for Cross-Domain Data Fusion: An Overview", Jan.-Mar. 2015, 19 pages, IEEE Transactions on Big Data, vol. 1, No. 1.

* cited by examiner

NON-TRANSITORY COMPUTER-READABLE STORAGE MEDIUM
1202

PROGRAMMING INSTRUCTIONS 1204,
CONFIGURED TO CAUSE A DEVICE, IN RESPONSE TO EXECUTION
OF THE PROGRAMMING INSTRUCTIONS, TO PRACTICE (ASPECTS
OF) EMBODIMENTS OF THE PROCESS(ES) DESCRIBED
THROUGHOUT THIS DISCLOSURE.

FIG. 8

COMPUTER-ASSISTED (CA)/AUTONOMOUS DRIVING (AD) VEHICLE INFERENCE MODEL CREATION

TECHNICAL FIELD

Embodiments described herein generally relate to field of computer-assisted or autonomous driving (CA/AD). In particular, apparatuses, methods, and systems for identifying locations problematic for an autonomous driving/computer assisted vehicle and improving performance are described.

BACKGROUND

Modern vehicles, such as automobiles, may be equipped with various safety systems, such as blind spot detection, adaptive cruise control, and automatic emergency braking. These systems may be part of a CA/AD vehicle. A CA/AD vehicle may be configured with systems that assist a driver (such as lane keeping and automatic emergency braking), and/or partially or fully allow the vehicle to navigate autonomously (e.g. self-driving vehicles). Assist and safety systems, as well as navigation and/or driving systems for fully autonomous vehicles, may use object detection and recognition to help ensure safe navigation and obstacle avoidance. To accomplish object detection and recognition, CA/AD vehicles may be equipped with a variety of sensors that provide data to various vehicle navigation systems. CA/AD vehicles may also include other vehicle types such as unmanned aerial vehicles (UAVs) (commonly referred to as "drones"), which likewise may use object detection and recognition as part of navigation and obstacle avoidance.

BRIEF DESCRIPTION OF THE DRAWINGS

FIG. 8 illustrates a storage medium having instructions for practicing methods described with references to FIGS. 1-4, according to various embodiments.

DESCRIPTION OF EMBODIMENTS

Figure 1:
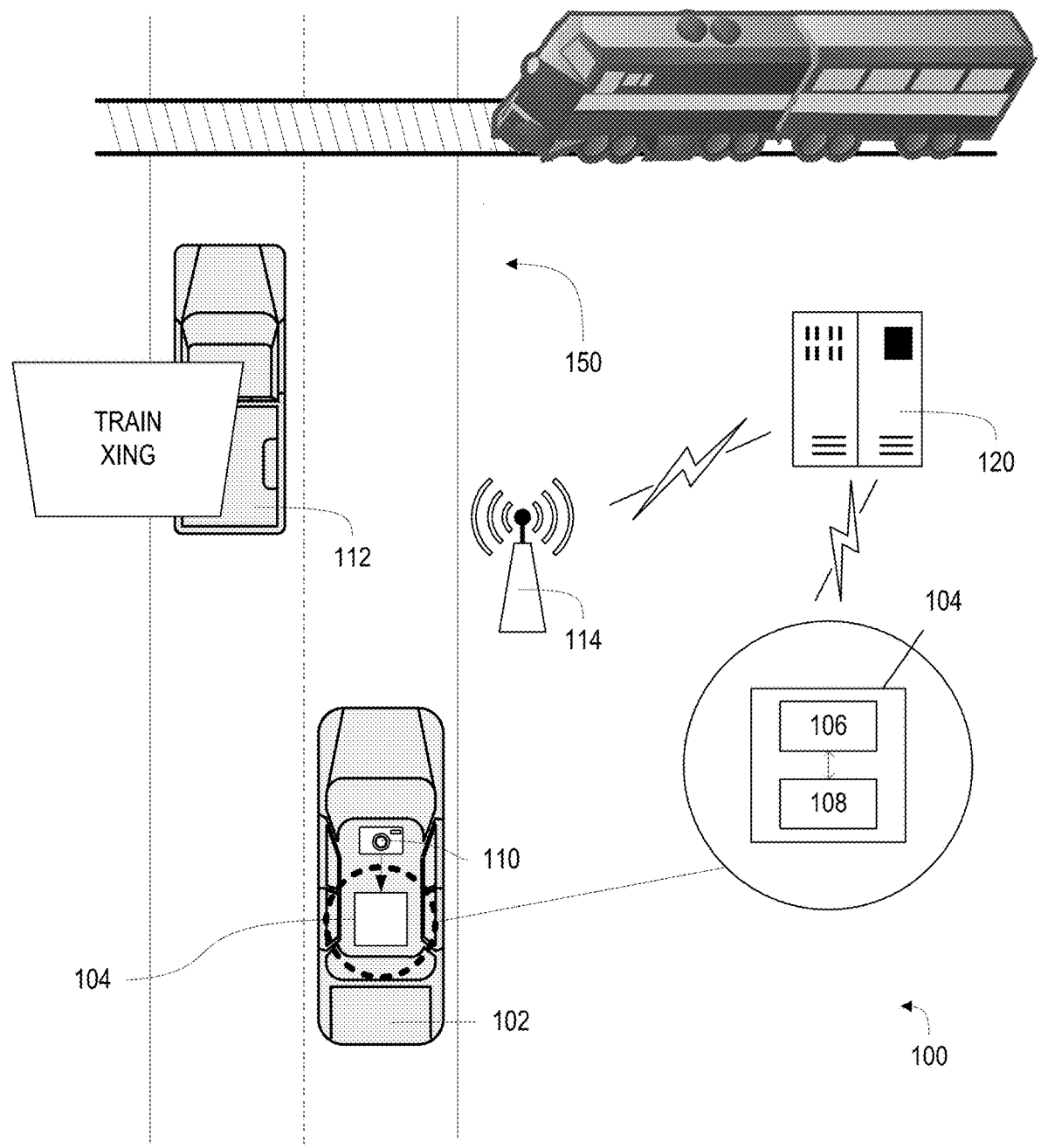
FIG. 1 is a diagram of a physical environment that may present a trouble spot for CA/AD vehicles, to be identified for creating/improving inference models, according to various embodiments.

Modern vehicles are often equipped with increasingly sophisticated computer assistance features to aid vehicle operators in situational awareness and safe operation. Such features include lane keeping assistance, blind spot detection, cross-traffic detection, adaptive cruise control, emergency automatic braking, and so forth. These various assistance features rely upon a variety of sensors placed upon the vehicle being operated to detect objects or obstacles that are relatively proximate to the vehicle. By expanding the number and types of sensors, and with improvement of on-board processing power, the capabilities of assistance features may range up to fully autonomous driving systems, e.g., self-driving vehicles, with other vehicles offering greater or lesser degrees of autonomous driving.

One way in which computer-assisted and autonomous driving systems may be improved is through the use of artificial intelligence (AI), potentially powered by one or more neural networks (NNs)(e.g., convolutional neural networks (CNNs), deep neural networks (DNNs), and other suitable configurations). Neural networks, as is known, may be trained by exposure to various data sets representative of the problems to be solved by the NN, along with expected solutions. While how a NN is trained may vary depending upon implementation and training technique (e.g. a DNN may only be told that an answer is incorrect, but not the correct answer, to allow the DNN to self-train), a NN provided such a training set builds connections between nodes so that each training case, if input to the NN, ultimately results in the expected solution. The greater the variety of sets used to train the NN, the more useful the NN may become to accurately solve problems. Subsequent data may then be analyzed by the trained NN and, provided that a sufficiently variable series of training sets was employed, correct results may be provided by the NN. Further, a NN may be configured with or generate an inference model that allows the NN to solve problems against data sets that may differ somewhat from the training sets, such as by inferring an appropriate response from roughly similar training data.

Despite improvements in sensor quantity and type, processing power, and use of broadly diverse training sets and inference models, and because the vast number of variables a CA/AD vehicle may encounter in driving conditions can exceed even the broadest training sets, the autonomous driving systems of many CA/AD vehicles may nevertheless encounter geographic locations the autonomous systems are unable to properly analyze. Without proper analysis, the driving system may be unable to provide a guidance/steering solution or, worse, the driving system may calculate a solution that can potentially lead to a collision. Either scenario may require a driver or passenger (where the CA/AD vehicle is fully autonomous)—hereinafter, simply "driver"—to assume manual control of the vehicle to avoid a collision. The later scenario—miscalculating a solution—may stem at least partially from use of a flawed inference model that generates improper inferences from sensor data.

For example, some locations may be properly analyzed by a driving system under typical conditions (e.g. normal traffic flow, relatively clear weather, no unexpected objects or vehicles), but may be misanalyzed when unusual, transient conditions are encountered, e.g., snow or other material that obscures normally visible features of surrounding obstacles, the unexpected presence of pedestrians, construction zones disrupting expected road structures, mis-painted road lines, the presence of irregular vehicles such as trains crossing a roadway (which may be either at grade or grade-separated), etc. Such changes to the environment may be outside the scope of the training data sets, and the inference model accordingly may not be configured to properly interpret these unexpected variables.

Disclosed embodiments include systems, apparatuses, and methods for improving the accuracy of CA/AD driving systems. In some embodiments, real-world data is collected from one or more vehicles (which may or may not be CA/AD vehicles), and an initial inference model is tested against this real-world data to determine the presence of any problem locations. These problem locations may be identified by passing the real-world data into a CA/AD driving simulator also configured with the initial inference model, and then comparing the solution(s) provided by the simulator against the actions taken by a human driver in the same location and under the same conditions (e.g. the environment encountered by the driver is the same or substantially similar as reflected by the real-world data). If the responses differ, the inference model may be refined using the human actions. In some embodiments, one or more additional data categories may be identified, the collection of which would aid in refining or improving the inference model. Additional vehicles (which may or may not be CA/AD vehicles) may be dispatched to the problem location to collect data in the additional categories. The additional category data may then be again passed through the simulator and used to further refine or improve the inference model. Once an improved inference model is generated, it may be provided to CA/AD vehicles to improve their performance and, as a consequence, safety.

As used herein, the term semi-autonomous driving is synonymous with computer-assisted driving. The terms do not mean exactly 50% of the driving functions are automated. The percentage of driving functions automated may be a fraction of a percent to almost 100%.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

FIG. 1 depicts a system 100 for an apparatus 104 to navigate a computer-assisted or autonomous driving (CA/AD) vehicle 102. Apparatus 104, in various embodiments, includes a command generator 106 to provide operational commands, such as acceleration, steering, braking and other like commands, to the vehicle 102 based upon a first inference model (discussed below with respect to FIG. 2) and data received from one or more sensors 110 that may be fitted onto vehicle 102. In embodiments, apparatus 104 also includes a feedback collector 108 to receive data on driver actions taken in response to the operational commands, such as if a driver of vehicle 102 places the vehicle into a manual drive mode, or if the driver needs to override autonomous acceleration, steering or braking for any reason. Apparatus 104, in embodiments, transmits data collected from the one or more sensors 110 and the data on the driver actions to a remote server 120, and may receive from the remote server 120 a subsequent refined or improved inference model, the second inference model generated from the first inference model updated with the data from the one or more sensors 110 and the data on the driver actions. Remote server 120 may be implemented as a part of system 200, and in particular a type of server 202, which will be described below with respect to FIG. 2.

While vehicle 102 is depicted as a car or truck, e.g. a self-driving vehicle, the disclosed embodiments are not intended to be limited to only self-driving automobiles. Any other type of autonomously or semi-autonomously guided vehicle may employ the disclosed embodiments. Other possible types of vehicle 102 include trucks, off-road vehicles, military vehicles (e.g., tanks, transports, etc.), aerial vehicles including drones and other manned or unmanned aerial systems, watercraft, or any other suitable conveyance capable of being equipped for at least semi-autonomous guidance.

Apparatus 104, in embodiments, is capable of communicating with various remote systems, such as remote server 120. In some embodiments, apparatus 104 is equipped with a transceiver (not shown) for wireless communication with the remote server 120, such as to receive information from providers of travel information, e.g. maps, weather, points of interest, etc., to receive updates, such as system firmware upgrades, and other information useful to its functioning. Similarly, apparatus 104 may transmit information to remote server 120, including vehicle status and diagnostic information, data from sensors 110, and identification of trouble spots, as will be discussed in greater detail below.

Command generator 106, in embodiments, is configured to determine, from various inputs such as sensors 110 as well as potential data from a remote provider, commands that can be supplied and used by an automatic steering system equipped to vehicle 102, to allow vehicle 102 to autonomously drive. Command generator 106 may also be coupled to a navigation system, such as GPS, to receive directions to a desired destination. Depending on the embodiment, either apparatus 104 or command generator 106 may include one or more NNs which first receive the input from sensors 110 and use the input to determine the presence and location of obstacles in the path, or potentially in the path, of vehicle 102. This presence and location information may then be provided to command generator 106 (when apparatus 104 includes the NN), which then determines a navigation or guidance solution to avoid the obstacles while also providing operational commands to direct vehicle 102 to its intended destination. In some embodiments, command generator 106 is integral with or otherwise comprises, in whole or in part, vehicle 102's autonomous driving system. In other embodiments, command generator 106 is integral with or otherwise comprises, in whole or in part, a navigation system. In still other embodiments, command generator 106 may provide commands to a driver assistance function on vehicle 102 in only certain circumstances, e.g. a detected obstacle that is determined to present a collision hazard, and otherwise allow the driver to operate vehicle 102.

Command generator 106 is in communication with feedback collector 108. Feedback collector 108, in turn, monitors for any interactions by a driver (or passenger, where vehicle 102 is fully autonomous) where the driver assumes manual control of vehicle 102. Thus, feedback collector is in communication with one or more sensors (which can be considered part of sensors 110), in some embodiments, that are arranged to detect inputs from a driver when the driver exercises (or attempts to exercise) manual guidance of vehicle 102. For example, controls including the steering wheel, accelerator pedal, and brake pedal on vehicle 102 may be fitted with position sensors that can detect changes to the controls' positions as a result of driver input. In some embodiments, apparatus 104 may discontinue providing operational commands to vehicle 102 when driver inputs are detected, to ensure that the driver is not fighting against the driving system of vehicle 102. In still other embodiments, apparatus 104 may begin recording the driver inputs via the position sensors upon detecting driver input, for later transmission of the driver inputs along with other data captures from sensors 110 to remote server 120.

In addition to position sensors on vehicle 102's controls, in embodiments, apparatus 104 is in communication with and receives data from various data sources of sensors 110. Sensors 110 may include video, audio, LIDAR, radar, ultrasonic, and similar types of detectors or sensors for the external environment of vehicle 102, as well as internal sensors such as speed, acceleration, and equipment status such as whether the brakes are applied, the throttle is applied, turn signal actuation, anti-lock brake system status, rain sensors, wiper actuation, and/or any other similar data that may be used by vehicle 102 to navigate around vehicle 102's environment, and are also useable to determine the presence of a problematic or trouble spot 150. It will be understood that the types of data will depend upon the nature of the data source.

As shown in the embodiment depicted in FIG. 1, apparatus 104 is equipped to a vehicle 102, and interfaces with the vehicle 102's steering and navigation systems. In some embodiments, apparatus 104 is at least part of vehicle 102's navigation system. In still other embodiments, apparatus 104 is integrated into various other systems of vehicle 102. Where vehicle 102 is a CA/AD vehicle, apparatus 104 may thus provide at least some of the computer-assisted or autonomous driving functionality. Computer assistance may range from driver assist systems similar to blind spot and cross-traffic warnings, may include a level of automatic control, such as an emergency braking system or lane keeping system, or may range to full autonomous driving (a/k/a self-driving or driverless) vehicles.

FIG. 1 also depicts an example trouble spot 150. Broadly, trouble spot 150 is any location with a driving environment that is challenging for a driving system on a CA/AD vehicle to process and determine a reliably safe and/or appropriate solution. In the depicted example, trouble spot 150 is an at-grade train crossing, with a train approaching. In some driving environments, a low-speed train crossing may lack signals that indicate the approaching of a train, such as lights, bells, and gates or cross-bucks, that if present would be reliably detected by an autonomous driving system. In such locations, the only indication of an approaching train may be the train itself, with its aural warning signals. In other locations, any present signals may be obscured in some fashion or otherwise not operational. A driving system may thus not reliably detect the approaching train, despite being configured to detect cross-traffic and able to safely traverse the train crossing in the absence of a train.

Other possible example trouble spots 150 may have a train traversing over or under the roadway (grade separated crossing), with a bridge or flyover. In contrast to an at-grade crossing, grade separated crossings typically lack any signage or other indications of the presence of a train crossing. However, a train approaching may still be detected by the driving system, which may cause the driving system to erroneously apply the brakes or otherwise act to avoid the train on its separated crossing. Still other trouble spots 150 may include roadways where lane lines have been repainted or have faded paint, such that the driving system may be unable to engage in lane keeping, while a human driver would be able to discern the actual lane lines and drive accordingly. A trouble spot may include other transient phenomena that can act to cause confusing data from sensors 110 to the driving system. The foregoing are a few examples of possible trouble spots. It should be appreciated that a wide variety of trouble spots are possible and listing all possible or likely trouble spots is not feasible.

FIG. 1 also depicts a second vehicle 112. Second vehicle 112, as will be discussed further herein, may be equipped in a similar fashion to vehicle 102, including sensors 110 and possibly an apparatus 104. As with vehicle 102, second vehicle 112 need not be limited to a road vehicle such as a car, but could be any other suitable type of vehicle, e.g. truck, military vehicle, drone, UAS, watercraft, etc.

Also depicted is a stationary data source, in the form of a road controller 114. Road controller 114 may include any relatively fixed location adjacent to, over, or on the roadway that may be equipped with one or more sensors useable by vehicle 102 with the apparatus 104 and methods described herein. For example, road controller 114 may include light stanchions, street signs, highway signs, overpasses, trees, buildings, terrain, cellular communication base or relay station or any other structure or feature proximate to the roadway where sensors can be mounted (or integrated) with a visible or sensorial view of the roadway. Road controller 114 may include sensors that would not ordinarily be found upon a vehicle, such as weather condition sensors to determine the presence of fog, haze, smoke, or other visual impediments, and roadway conditions such as wet, dry, snowy, icy, etc., that may become factors in ascertaining the risk of a vehicle maneuver. Stationary, as used here, means stationary relative to the roadway. Road controller 114, along with second vehicle 112, are in communication with/ part of system 200, to be described herein. Road controller 114 and second vehicle 112 can provide additional types of data, and data from different perspectives, than sensors 110 on vehicle 102.

Embodiments of apparatus 104, as discussed above, may be in communication with one or more radios capable of transmitting and receiving signals using various suitable wireless communications techniques. One possible embodiment is a transceiver (not shown), which combines receiver circuitry and transmitter circuitry. Other embodiments may use a discrete receiver that is separate from a discrete transmitter. Communications techniques may involve communications across one or more wireless networks. Some example wireless networks include (but are not limited to) wireless local area networks (WLANs), wireless personal area networks (WPANs), wireless metropolitan area network (WMANs), cellular networks, and satellite networks. In communicating across such networks, the transceiver (which term contemplates embodiments with integrated receive/transmit circuitry as well as embodiments with either or both discrete receiver/transmitter circuitry) may operate in accordance with one or more applicable standards in any version. To this end, the transceiver may include, for instance, hardware, circuits, software, or any combination thereof that allows communication with external computer systems.

In some specific non-limiting examples, the transceiver may comport with the Institute of Electrical and Electronics Engineers (IEEE) 802.11 standard (e.g., Wi-Fi), a Bluetooth®, ZigBee®, near-field communication, or other suitable wireless communication standard. In addition, the transceiver 220 may comport with cellular standards such as 3G (e.g., Evolution-Data Optimized (EV-DO), Wideband Code Division Multiple Access (W-CDMA)) and/or 4G wireless standards (e.g., High Speed Packet Access (HSPA), Worldwide Interoperability for Microwave Access (WIMAX), Long-Term Evolution (LTE)).

Figure 2:
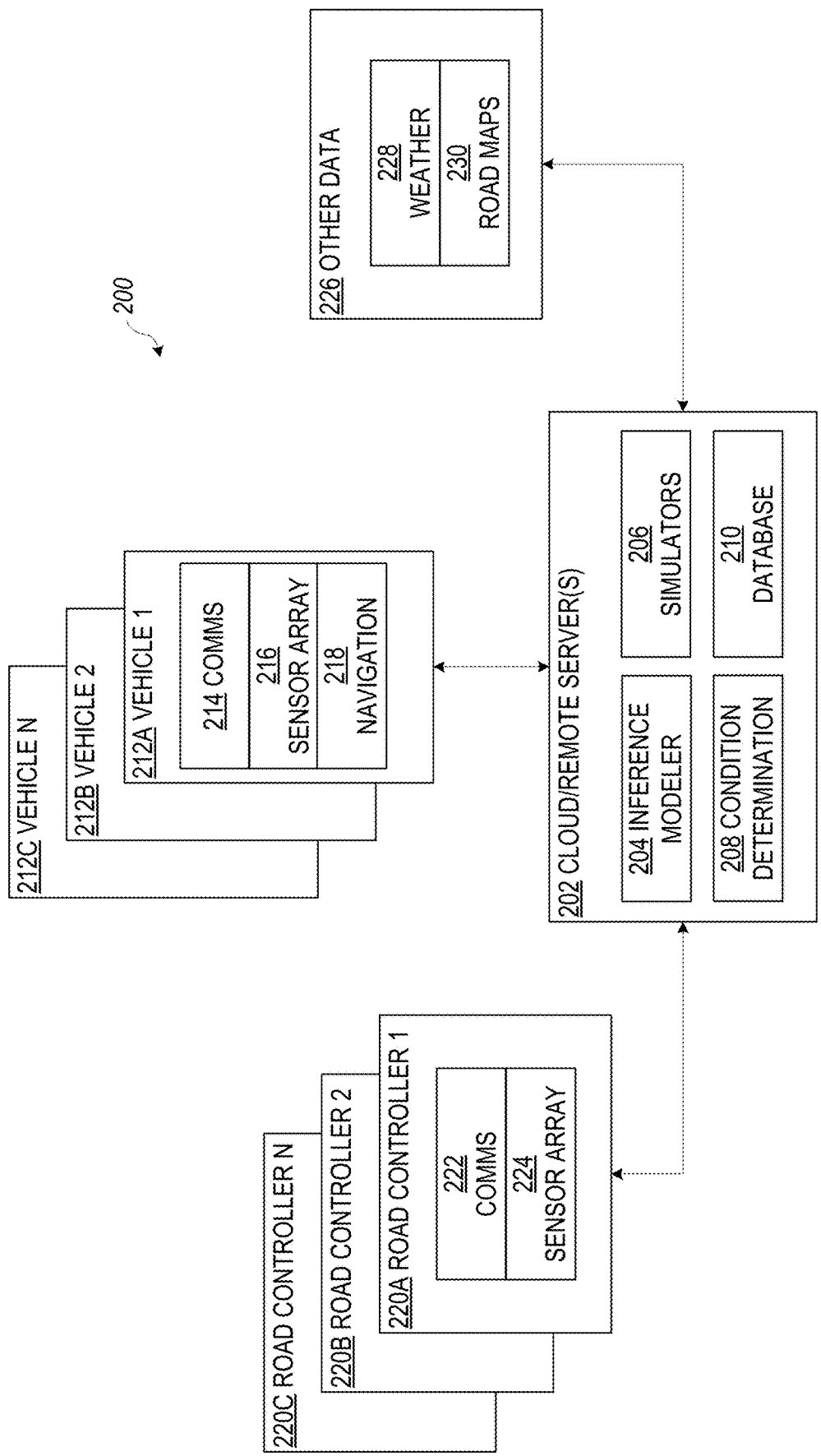
FIG. 2 is a block diagram of a system for identifying trouble spots for CA/AD vehicles and creating/improving inference models, according to various embodiments.

Turning to FIG. 2, the components of a system 200 for improving inference models for identified trouble spots or locations 150 is depicted. System 200, in embodiments, includes one or more cloud or remote servers 202, one or more vehicles 212A-212C, one or more road controllers 220A-220C, and other external data sources 226, each in communication with server 202. Other embodiments may have additional components or may omit one or more of the foregoing components. Vehicles 212A-212C, road controllers 220A-220C, and other data sources 226 each provide data to remote server 202, in embodiments.

Cloud or remote server 202, in the depicted embodiment, includes an inference modeler 204, one or more simulators 206, a condition determination module 208, and a database 210. These components may be implemented as software that runs on server 202, as hardware such as a module or modules that can be coupled to server 202, or as a combination of hardware and software. Other embodiments may have more components or may omit one or more of the foregoing components. Server 202, in various embodiments, may be implemented as a remote or cloud-based, e.g. Internet-accessible, server, or may be specific to a given implementation of system 200, and hosted in a facility and/or on a network essentially separate from the Internet and/or other systems. Such a facility may be dedicated solely to system 200 and any connected devices or entities.

Inference modeler 204, in embodiments, constructs an inference model from various data as input, as part of training a DNN or CNN. As mentioned above, data input may come from vehicles 212A-212C, road controllers 220A-220C, and/or other data sources 226 (hereinafter collectively referred to simply as "data sources"). Such data may be tagged with information including a date/time stamp as well as location information about where the data was captured, orientation of the capturing vehicle, and any other pertinent factors. In one possible embodiment, inference modeler 204 trains a DNN or CNN from data captured from a specific physical location (such as problem or trouble spots 150). Inference modeler 204 then modifies the trained DNN or CNN to generate a streamlined inference model. The inference model can then be tested and refined as described herein, and/or supplied and adapted to other NNs, such as may be equipped to apparatus 104 for use in processing input from sensors 110 and generating operational commands. As will be understood by a person skilled in the relevant art, an inference model may essentially comprise an optimized or streamlined NN configuration that is purpose-specific, e.g. tailored just for processing input that can be used to generate operational commands.

Simulator(s) 206, in embodiments, are used to test the results of an inference model generated by inference modeler 204. Simulator 206 may be configured with similar AI/NN hardware and/or software as apparatus 104, to ensure the responses resulting from testing an inference model substantially match the responses apparatus 104 would generate if using the inference model. Multiple simulators 206 may be deployed, as the resources of server 202 permit, to allow testing of multiple inference models in parallel, or for testing a single inference model with data from multiple physical locations (such as with different data sets). Simulator 206, in the example embodiment, is provided with at least a subset of the data used by inference modeler 204 to generate an inference model. Such data may come from vehicles 212A-212C, road controllers 220A-220C, and/or other data sources 226. The results of the simulator 206 are compared, in embodiments, against data on human driver responses to the same location and driving situation, e.g. how the driver interacts with the trouble spot 150 vs. the response from simulator 206, to determine how to refine the inference model being tested. This process will be discussed in greater detail herein.

Server 202 may also include a condition determination module 208, which analyzes the data received from the data sources to determine possible transient variables, such as the passage of other vehicles such as trains, temporary alterations of the trouble spot 150 due to construction or other transportation activities, weather impacts, time of day impacts (such as the sun angle obscuring or washing out road markers, or causing an optical illusion that apparatus 104 may interpret as another vehicle or obstacle). Feedback from condition determination module 208 may be used by server 202 in conjunction with inference modeler 204 and simulators 206 to determine additional categories of data to capture or to isolate particular factors that may cause the simulator results to differ from human driver responses.

Finally, in the embodiment depicted in FIG. 2, the server 202 may include a database 210, which can act as a storage repository for data from the data sources, various copies or versions of inference models, simulator 206 responses, and other information useful to system 200 to carry out its functions.

The data sources include one or more vehicles 212A, 212B, and/or 212C (collectively, vehicle 212). While three vehicles are depicted, it should be understood that any arbitrary number of vehicles may be in communication with server(s) 202. Each vehicle 212 may be implemented the same as vehicle 102 and second vehicle 112, described above with respect to FIG. 1. A given vehicle 212 may include a communications module 214, a sensor array 216, and a navigation system 218. Communications module 214, in embodiments, can be implemented as a transceiver or discrete receiver and transmitter, and may be wireless, as discussed above with respect to apparatus 104. Sensor array 216, likewise, can be implemented similar to sensors 110. Finally, navigation system 218 may be passive, e.g. a GPS or similar satellite navigation system like those commonly available on many smartphones and vehicle infotainment systems, or may be semi- or fully autonomous, providing operational commands to allow vehicle 212 to autonomously travel to a selected destination.

Vehicle 212, in embodiments, is arranged to supply server 202 with data from its sensor array 216, such as via communications module 214. In some embodiments, such data may be supplied automatically on a continuous or periodic basis as vehicle 212 is operated, without requiring specific interaction from an operator. Vehicle 212 may also receive feedback via communications module 214 from server 202. Such feedback may include new or updated inference models, which may be used by navigation system 218, depending on a given implementation, as well as instructions to travel to a trouble spot 150 to collect additional data, and instructions as to whether and what sort of specific data to gather. In some embodiments, vehicle 212 may be a conventional vehicle (as opposed to a CA/AD vehicle) that is manually driven by a driver. The driver, where server 202 instructs vehicle 212 to collect additional information from a specific trouble spot 150 and regardless of whether vehicle 212 is autonomous or conventional, may be presented with incentives to encourage travel to the trouble spot 150.

In embodiments, one or more road controllers 220A, 220B, and 220C (collectively, road controller 220) provide stationary and/or ground reference data for a specific trouble spot 150, to allow for refinement of inference models. As with vehicle 212, road controller 220 may be an implementation of road controller 114, described above with respect to FIG. 1. One or more road controllers 220 may be deployed; it should be understood that the three road controllers depicted are merely for example, and a given implementation of system 200 may have any arbitrary number of road controllers in communication. Each road controller 220 may include a communications module 222. Communications module 222, in embodiments, can be implemented as a transceiver or discrete receiver and transmitter, and may be wireless, as discussed above with respect to apparatus 104 in FIG. 1. Sensor array 224, likewise, can be implemented similar to sensors 110 on vehicle 102.

Other data sources 226 include, in various embodiments, remote sources such as weather 228, such as measured weather conditions and forecast information (which may be measured by a road controller 220 or other device in communication with system 200), road maps 230, such as topography, transient construction alterations, and road closures, to name a few examples, and traffic data (e.g. as may be provided by services such as WAZE®). Other data may include time tables for any transient occurrences, such as a train schedule or bridge lift schedule, construction and road closure timelines, rush hour traffic times and volumes, and any other potentially relevant external data that may be obtained from remote systems, such as over the Internet. The data may aggregated, merged, reconciled, or otherwise combined with data from vehicles 212 and road controllers 220 by server 202.

Each of the data sources is in communication with server 202, and may communicate via a wired or wireless link, as appropriate; for example, a vehicle 212 likely will communicate via a wireless link, while a road controller 220 may be able to communicate via a wired link. Other data sources 226, while depicted as separate, may be directly accessed via server 202, such as over the Internet or another network connection.

One or more components of apparatus 104 and/or system 200, in embodiments, include or is implemented using, for example, one or more processors situated in separate components, or alternatively one or more processing cores embodied in a component (e.g., in a System-on-a-Chip (SoC) configuration), and any processor-related support circuitry (e.g., bridging interfaces, etc.). Example processors may include, but are not limited to, various microprocessors such as general-purpose processors that may be used for general-purpose computing, and/or microprocessors that are purpose-built, such as specifically for processing of digital signals, and more specifically for processing of digital audio signals. Examples may include processors of the iAPX family, ARM family, MIPS family, SPARC family, PA-RISC family, POWER family, or any other suitable processor architecture now known or later developed. Still other embodiments may use an application-specific integrated circuit (ASIC) or field-programmable gate array (FPGA).

It should also be understood that in some embodiments of apparatus 104 and system 200, the various components may use a variety of different arrangements, including different types, so long as a given implementation maintains any necessary functionality. For example, in one particular embodiment, apparatus 104 is implemented as software to be executed on a vehicle 102 control unit, infotainment system, or other suitable module, such as instructions stored on a medium, to be executed by a computer device (described herein). In other embodiments, portions of apparatus 104 and/or system 200 may be implemented as software, with other portions implemented in hardware. It will be appreciated the various blocks in FIGS. 1 and 2, including those of system 200 as well as apparatus 104, are simply logical depictions of functions; the actual implementation of the blocks can vary from embodiment to embodiment, with functions of different blocks potentially being split or combined into one or more software and/or hardware modules. Some of the components may be omitted or moved to other locations, depending upon a given implementation.

Figure 3:
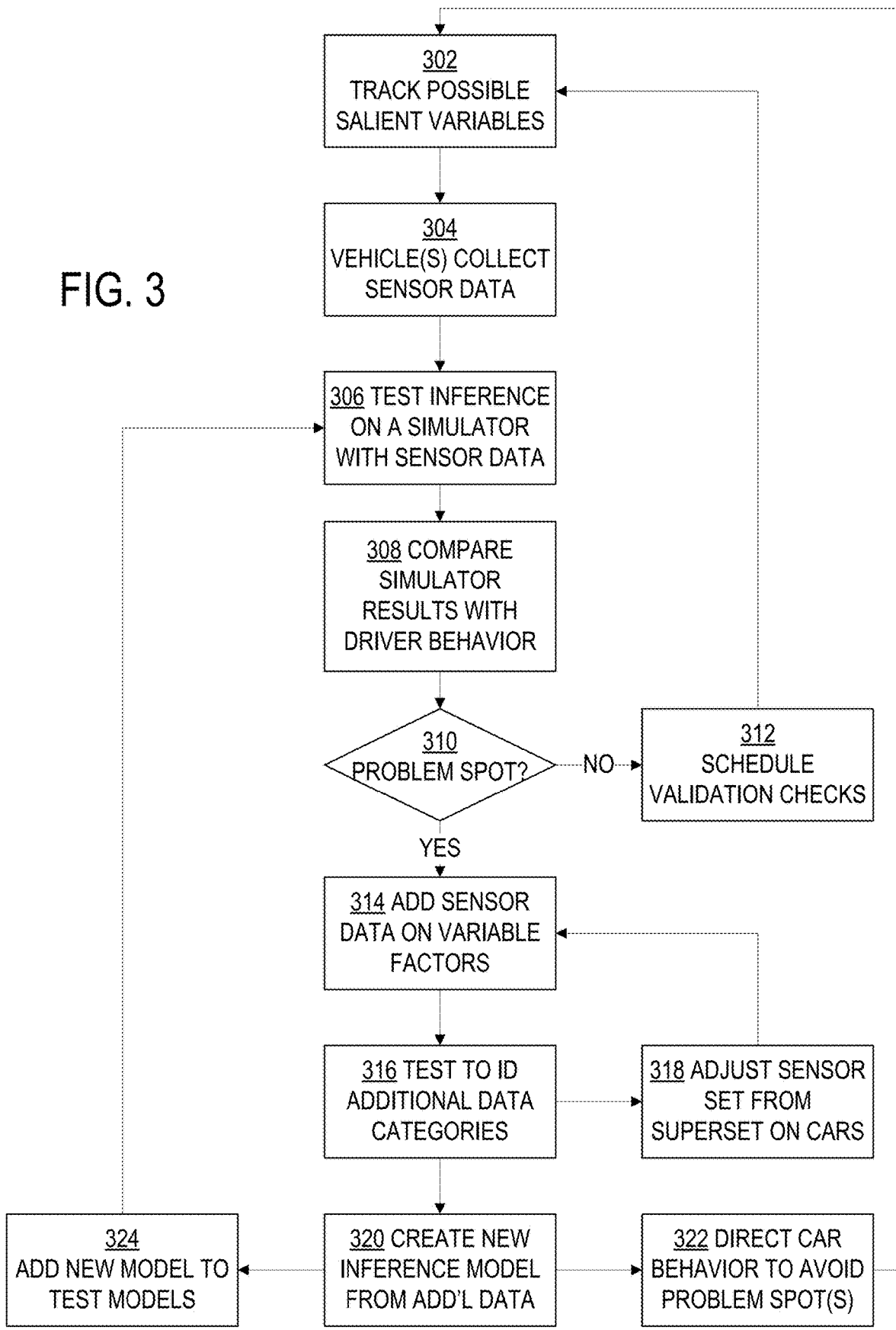
FIG. 3 is a block diagram of the flow for generating improved inference models for trouble spots identified by the system depicted in FIG. 2, according to some embodiments.

In FIG. 3, a block diagram of the flow for identifying trouble spots and generating improved inference models is depicted. The blocks and operations of FIG. 3 may be performed, for example, by the system 200, including one or more of its constituent components, such as a server 202 depicted in FIG. 2, according to some embodiments. The various operations of the blocks of FIG. 3 may be performed in whole or in part. Starting with block 302, data is obtained from the various data sources, and any possibly salient variables are tracked. As mentioned above, data may be automatically pushed to a system implementing the blocks of FIG. 3 in some embodiments; in other embodiments, the data may be requested, or a combination of push and request may be employed, possibly varying depending upon the nature of a given data source. Data associated with a trouble spot 150 in particular may be collected, if a trouble spot 150 has already been identified. Such variables may include, but are not limited to, weather conditions, traffic conditions, schedules of transient objects, time of day, and any other fluctuating conditions that may impact how an apparatus, such as apparatus 104, analyzes data from sensors, such as sensors 110. The data to be tracked is collected in block 304 from one or more vehicles, such as vehicles 212 as described above, and may be provided to a server, such as server 202 of system 200.

In block 306, the collected sensor data (and other information) is used to generate an inference model, similar to that described above with respect to inference modeler 204 of FIG. 2. The inference model is then tested on a simulator, in the depicted embodiment, such as simulator 206, using the collected sensor data and information, to determine the actions an apparatus implementing the inference model likely to take in response. These actions are then compared, in block 308, with data on driver behavior. Driver behavior data may be collected from a vehicle 212, similar to vehicle 102, as described above. Specifically, driver actions input into vehicle controls are collected, in embodiments, and provided for analyzing inference model simulation results. As data may be periodically or even continuously collected by multiple vehicles in communication with an implementing system, testing, simulating, and comparing actions may take place on a continuous or frequent basis to validate all locations traversed by a CA/AD vehicle.

These results are compared in block 308 with the driver behavior data to determine if a trouble or problem spot has been identified. For example, a train passing on an overhead bridge may be mis-recognized by a CA/AD vehicle as being at-grade, which would command an emergency stop. In contrast, a human driver may recognize that the train is crossing on a grade-separated bridge and proceed down the road normally. These differing results may indicate that a problem spot exists. If no problem spot exists or is otherwise identified, a given geographic location may be tagged, in block 312, for scheduled validation checks. Collected data from the data sources may include geographic information (e.g., geo tags), which can be used to ensure a subsequent validation check is performed in the correct location.

If a problem spot is recognized or identified, in block 314 data for variable factors, described above with respect to FIG. 2, and other data sources 226, may be added to the collected data that is simulator tested, if not previously integrated. These variable factors may then be tested in block 316 to confirm the trouble or problem spot, and/or possibly to isolate one or more specific factors that impact or otherwise cause the problem spot (e.g. weather conditions or sun angle at certain times of day). These additional data categories may be used to direct or modify subsequent data collection, such as from a data source described with respect to system 200 in FIG. 2. For example, in block 318 the sensor set for a car, such as a vehicle 102 or 212, may be adjusted to obtain a subset of data from all possible data that a given sensor package on the vehicle may be capable of capturing. This adjusted data set can be fed back to block 314, where variable data is added, in some embodiments.

In block 320, following testing in block 316, a new, or refined or revised, inference model is formed using the additional data from blocks 314 and/or 316. In some embodiments, the new inference model is based upon the existing model, which is simply tweaked or refined on the basis of the additional data.

In response to forming a new inference model, first, in block 324 the new or revised model is submitted for testing, similar to the initial inference model. This allows the revised or new model to be validated to determine whether the problem spot still exists (which may require further refining per blocks 310-320), if it has been resolved, and/or if any other problem spots have been identified or created as a result of the new or revised inference model.

In block 322, any vehicle in communication with a system or apparatus implementing the blocks of FIG. 3, such as a system 200 and/or apparatus 104, may be instructed to avoid or otherwise route around the identified problem spots, to avoid the vehicle possibly attempting to execute a dangerous or otherwise improper maneuver. Blocks 322 and 324 may be performed in parallel, such as where a new inference model is created but is not yet tested and/or validated. In such an example, a vehicle may be instructed to avoid problem spots on a temporary basis, pending validation that the updated inference model has resolved any problem spots. Still further, in block 322, one or more vehicles, possibly equipped with human drivers to prevent execution of a dangerous or improper maneuver, may be dispatched to the problem spot to collect additional data, such as specifically for the additional data categories identified in block 316.

If the inference model is determined to be substantially or entirely free of trouble spots (at least those capable of being identified and tested with available data sources and data sets), the inference model may be pushed out to one or more vehicles, such as vehicle 102, that are in communication with an implementing system, such as system 200. The inference model may then be used by, for example, an apparatus 104 to update its NN, to obtain safer driving behavior, to either successfully navigate or otherwise avoid any problem spots.

Figure 4:
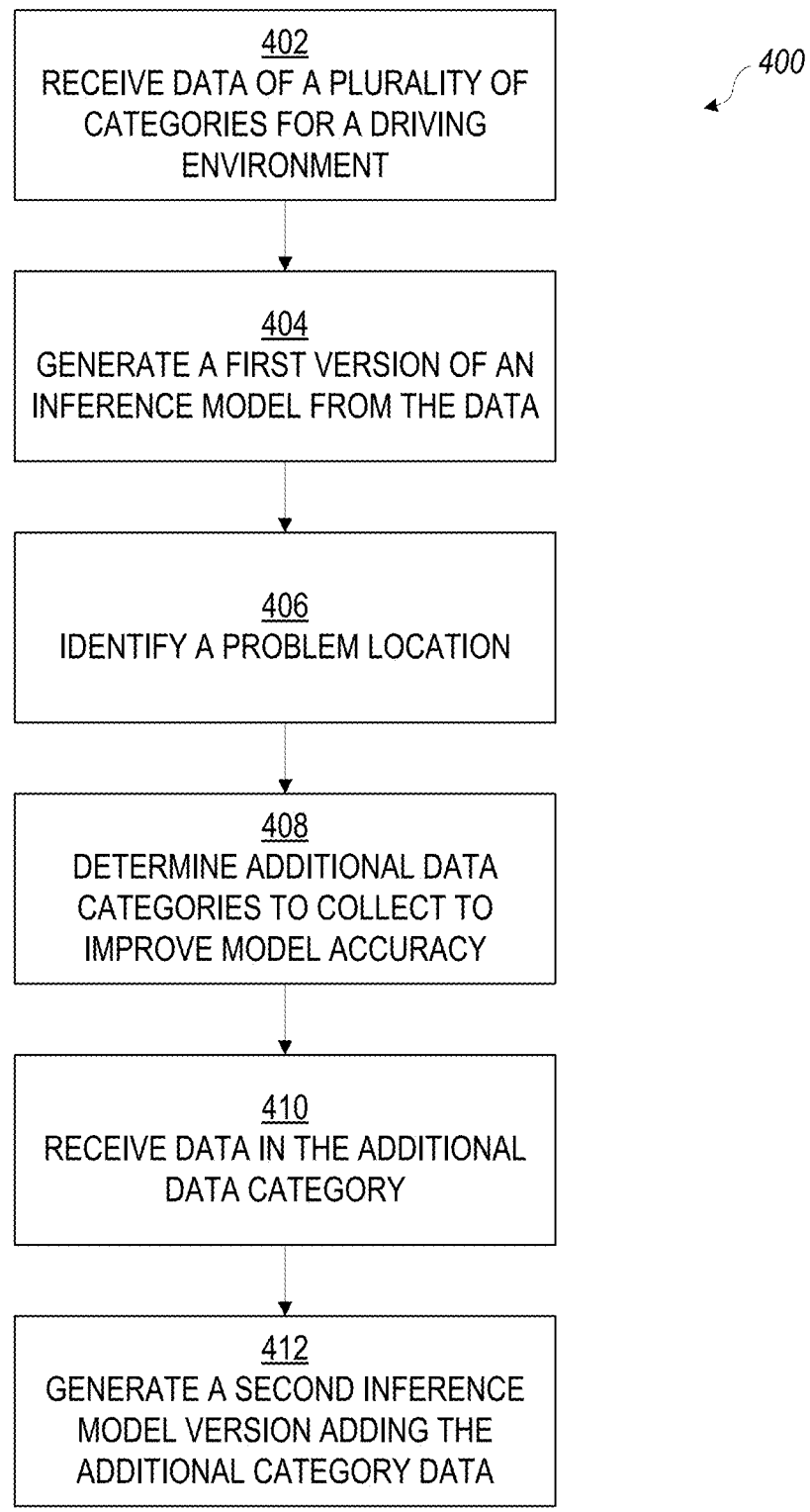
FIG. 4 is a flowchart of a method for correlating data from a remote source with data from local sources that may be carried out as part of FIG. 3, according to various embodiments.

Turning to FIG. 4, the operations of an example method 400 for improving inference models for handling trouble or problem spots are depicted. Method 400 may be performed in whole or in part, such as by a system 200 and/or apparatus 104. The operations of method 400 may have substantial overlap to one or more blocks depicted in FIG. 3 and so, in the interest of expedience, may not be explained in great detail here. The reader is directed to the foregoing description of FIGS. 1-3 for more details.

Starting in operation 402, data is received relating to a plurality of categories for a driving environment. Categories may include traffic conditions, signage, vehicles, crossings, weather conditions, road construction, and any other category of information that may be used by a CA/AD vehicle to analyze and determine a navigation solution.

In operation 404, the received data is used to generate a first version of an inference model. As described above, the inference model may be generated by training a NN, such as a DNN or CNN, with the received data, and then optimizing the trained NN to obtain a targeted inference model designed to analyze driving related data useful for CA/AD vehicle navigation.

In operation 406, the inference model is tested, using the received data and in comparison with human driver action data also collected, to identify any problem locations. The identified problem location may be iteratively tested using subsets of available data, including subsets of variable data, such as weather conditions, traffic conditions, train or other vehicle schedules, etc., to attempt to isolate and identify, in operation 408, one or more additional or different data categories to collect. The additional or different data categories may allow improving the inference model to correctly and reliably handle the identified problem location.

In operation 410, following identification of the one or more additional or different data categories, data for the identified category/categories is collected, such as by dispatching other vehicles and/or configuring any stationary sources or road controllers to obtain data in the identified category/categories.

Finally, in operation 412, a second or subsequent inference model is generated using the data from the identified category/categories, and possibly using the existing inference model and/or earlier data set. This second or subsequent inference model may then be passed through method 400 again in an iterative fashion, to potentially generate further, more refined or more accurate inference models.

Figure 5:
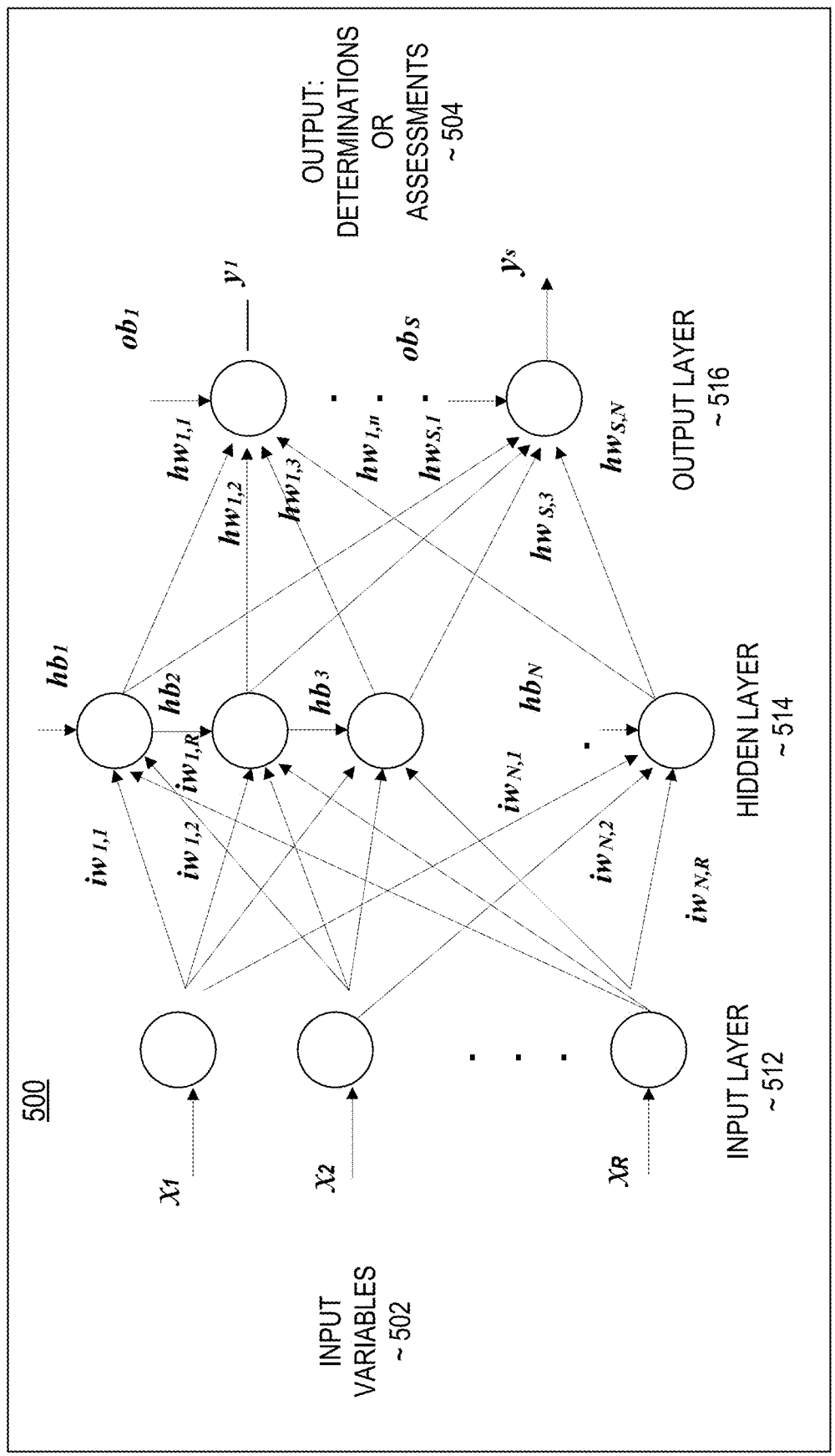
FIG. 5 illustrates an example neural network suitable for use with the present disclosure, according to various embodiments.

In some embodiments, apparatus 104, and in particular, system 200 (including server 202, inference modeler 204, and simulator(s) 206), may include one or more trained neural networks in performing its determinations and/or assessments. FIG. 5 illustrates an example neural network, in accordance with various embodiments. As shown, example neural network 500 may be a multilayer feedforward neural network (FNN) comprising an input layer 512, one or more hidden layers 514 and an output layer 516. Input layer 512 receives data of input variables ($x_i$) 502. Hidden layer(s) 514 processes the inputs, and eventually, output layer 516 outputs the determinations or assessments ($y_i$) 504. In one example implementation the input variables ($x_i$) 502 of the neural network are set as a vector containing the relevant variable data, while the output determination or assessment ($y_i$) 504 of the neural network are also as a vector.

Multilayer feedforward neural network (FNN) may be expressed through the following equations:

$$ho_i = f(\Sigma_{j=1}^{R}(iw_{i,j}x_j) + hb_i), \text{ for } i=1, \ldots, N$$

$$y_i = f(\Sigma_{k=1}^{N}(hw_{i,k}ho_k) + ob_i), \text{ for } i32\ 1, \ldots, S$$

where $ho_i$ and $y_i$ are the hidden layer variables and the final outputs, respectively. f( ) is typically a non-linear function, such as the sigmoid function or rectified linear (ReLu) function that mimics the neurons of the human brain. R is the number of inputs. N is the size of the hidden layer, or the number of neurons. S is the number of the outputs.

The goal of the FNN is to minimize an error function E between the network outputs and the desired targets, by adapting the network variables iw, hw, hb, and ob, via training, as follows:

$$E = \Sigma_{k=1}^{m}(E_k), \text{ where } E_k = \Sigma_{p=1}^{S}(t_{kp} - y_{kp})^2$$

where $y_{kp}$ and $t_{kp}$ are the predicted and the target values of pth output unit for sample k, respectively, and m is the number of samples.

In some embodiments, system 200, and in particular, server 202, inference modeler 204, and/or simulator(s) 206, may include a neural network 500 to evaluate the various collected data sources and data categories to identify a trouble or problem spot or location for a CA/AD vehicle. The input variables ($x_i$) 502 may include information from sensors 110, as well as any additional data that may be calculated or extrapolated by an apparatus 104. The information may be collected from multiple CA/AD vehicles, including multiple instances of apparatus 104. The output variables ($y_i$) 504 may include values indicating the navigation solution or operational commands that an apparatus 104 would issue based upon the information from sensors 110. The network variables of the hidden layer(s) for the neural network, including how to respond to sensor data, are determined by the training data.

In the example of FIG. 5, for simplicity of illustration, there is only one hidden layer in the neural network. In some other embodiments, there can be many hidden layers. Furthermore, the neural network can be in some other types of topology, such as Convolution Neural Network (CNN), Recurrent Neural Network (RNN), and so forth.

Figure 6:
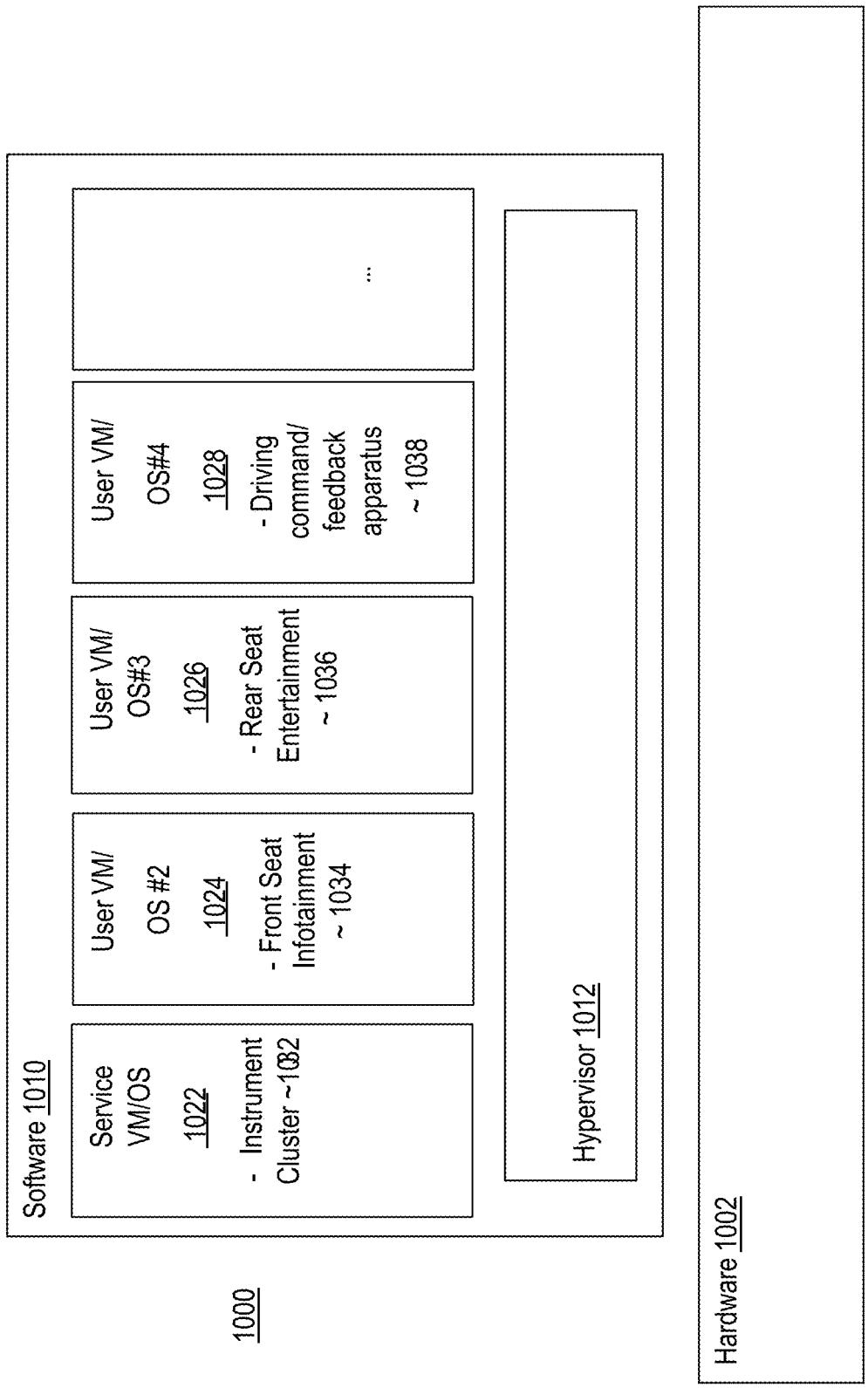
FIG. 6 illustrates a software component view of a possible implementation of apparatus of FIG. 2, according to various embodiments.

Referring now to FIG. 6, a possible software component view of a vehicle computer system 1000, which may incorporate apparatus 104, according to various embodiments, is illustrated. As shown, for the embodiments, vehicle computer system 1000 includes hardware 1002 which executed software 1010 in whole or in part. Vehicle computer system 1000 may provide some or all functionality of infotainment system 250 described above with respect to FIG. 2. Software 1010 includes hypervisor 1012 hosting a number of virtual machines (VMs) 1022-1028. Hypervisor 1012 is configured to host execution of VMs 1022-1028. The VMs 1022-1028 include a service VM 1022 and a number of user VMs 1024-1028. Service machine 1022 includes a service OS hosting execution of a number of instrument cluster applications 1032, which may include an instrument cluster display. User VMs 1024-1028 may include a first user VM 1024 having a first user OS hosting execution of front seat infotainment applications 1034, a second user VM 1026 having a second user OS hosting execution of rear seat infotainment applications 1036, a third user VM 1028 having a third user OS hosting execution of an apparatus 1038 for providing driving commands and collect feedback, which may be apparatus 104 of FIG. 1 (including command generator 106 and feedback collector 108), and so forth.

Except for apparatus 104, elements 1012-1036 of software 1010 may be any one of a number of these elements known in the art. For example, hypervisor 1012 may be any one of a number of hypervisors known in the art, such as KVM, an open source hypervisor, Xen, available from Citrix Inc, of Fort Lauderdale, Fla., or VMware, available from VMware Inc of Palo Alto, Calif., and so forth. Similarly, service OS of service VM 1022 and user OS of user VMs 1024-1028 may be any one of a number of OS known in the art, such as Linux, available e.g., from Red Hat Enterprise of Raleigh, N.C., or Android, available from Google of Mountain View, Calif.

Figure 7:
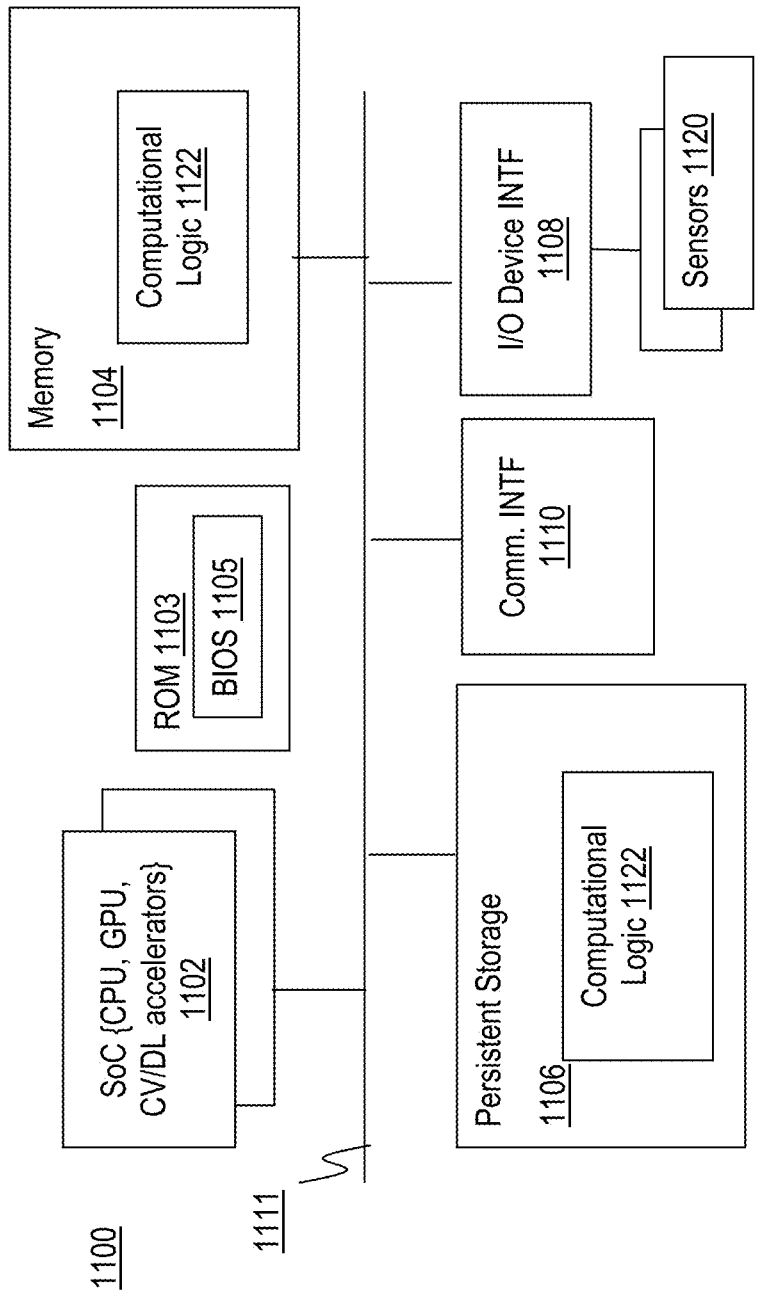
FIG. 7 illustrates a hardware component view of a possible implementation apparatus of FIG. 2, according to various embodiments.

Referring now to FIG. 7, an example computing platform that may be suitable for use to practice the present disclosure, according to various embodiments, is illustrated. In particular, computing platform 1100 may be employed to implement a CA/AD system that include apparatus 104 of FIG. 1, cloud/remote server 202 of FIG. 2, or hardware 1002 of FIG. 6. As shown, computing platform 1100 may include one or more system-on-chips (SoCs) 1102, ROM 1103 and system memory 1104. Each SoCs 1102 may include one or more processor cores (CPUs), one or more graphics processor units (GPUs), one or more accelerators, such as computer vision (CV) and/or deep learning (DL) accelerators. ROM 1103 may include basic input/output system services (BIOS) 1105. CPUs, GPUs, and CV/DL accelerators may be any one of a number of these elements known in the art. Similarly, ROM 1103 and BIOS 1105 may be any one of a number of ROM and BIOS known in the art, and system memory 1104 may be any one of a number of volatile storage known in the art.

Additionally, computing platform 1100 may include persistent storage devices 1106. Example of persistent storage devices 1106 may include, but are not limited to, flash drives, hard drives, compact disc read-only memory (CD-ROM) and so forth. Further, computing platform 1100 may include one or more input/output (I/O) interfaces 1108 to interface with one or more I/O devices, such as sensors 1120. Other example I/O devices may include, but are not limited to, display, keyboard, cursor control and so forth. Computing platform 1100 may also include one or more communication interfaces 1110 (such as network interface cards, modems and so forth). Communication devices may include any number of communication and I/O devices known in the art. Examples of communication devices may include, but are not limited to, networking interfaces for Bluetooth®, Near Field Communication (NFC), WiFi, Cellular communication (such as LTE 4G/5G) and so forth. The elements may be coupled to each other via system bus 1112, which may represent one or more buses. In the case of multiple buses, they may be bridged by one or more bus bridges (not shown).

Each of these elements may perform its conventional functions known in the art. In particular, ROM 1103 may include BIOS 1105 having a boot loader. System memory 1104 and mass storage devices 1106 may be employed to store a working copy and a permanent copy of the programming instructions implementing the operations associated with hypervisor 1012, service/user OS of service/user VM 1022-1028, components of apparatus 104, or, servers 202 (including inference modeler 204, simulator(s) 206), and so forth, collectively referred to as computational logic 1122. The various elements may be implemented by assembler instructions supported by processor core(s) of SoCs 1102 or high-level languages, such as, for example, C, that can be compiled into such instructions.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module" or "system." Furthermore, the present disclosure may take the form of a computer program product embodied in any tangible or non-transitory medium of expression having computer-usable program code embodied in the medium. FIG. 8 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 1202 may include a number of programming instructions 1204. Programming instructions 1204 may be configured to enable a device, e.g., computing platform 1100, in response to execution of the programming instructions, to implement (aspects of) hypervisor 1012, service/user OS of service/user VM 1022-1028, components of apparatus 104, or, server 202 (including inference modeler 204, and simulator(s) 206), and so forth. In alternate embodiments, programming instructions 1204 may be disposed on multiple computer-readable non-transitory storage media 1202 instead. In still other embodiments, programming instructions 1204 may be disposed on computer-readable transitory storage media 1202, such as, signals.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a," "an" and "the" are intended to include plural forms as well, unless the context clearly indicates otherwise. It will be further understood that the terms "comprises" and/or "comprising," when used in this specification, specific the presence of stated features, integers, steps, operations, elements, and/or components, but do not preclude the presence or addition of one or more other features, integers, steps, operation, elements, components, and/or groups thereof.

Embodiments may be implemented as a computer process, a computing system or as an article of manufacture such as a computer program product of computer readable media. The computer program product may be a computer storage medium readable by a computer system and encoding a computer program instructions for executing a computer process.

The corresponding structures, material, acts, and equivalents of all means or steps plus function elements in the claims below are intended to include any structure, material or act for performing the function in combination with other claimed elements are specifically claimed. The description of the present disclosure has been presented for purposes of illustration and description, but is not intended to be exhaustive or limited to the disclosure in the form disclosed. Many modifications and variations will be apparent to those of ordinary skill without departing from the scope and spirit of the disclosure. The embodiment was chosen and described in order to best explain the principles of the disclosure and the practical application, and to enable others of ordinary skill in the art to understand the disclosure for embodiments with various modifications as are suited to the particular use contemplated.

EXAMPLES

The following examples pertain to further embodiments.

Example 1 is a non-transitory computer readable medium (CRM) containing instructions executable by a processor in an apparatus, that when executed cause the apparatus to determine, based on results from using a first inference model in a computer-assisted or autonomous driving (CA/AD) system simulator, whether a simulated CA/AD system response to a driving environment in a geographic location differs from a response to the driving environment by a human driver, the first inference model having been generated based on at least a first category of data related to the driving environment; and if the simulated response differs from the human driver response, determine a second category of data to collect; receive data in the second category; and generate a second inference model from at least the first inference model and the received data of the second category.

Example 2 includes the subject matter of example 1, or some other example herein, wherein when executed, the instructions are further to cause the apparatus to use the second inference model to guide a vehicle.

Example 3 includes the subject matter of example 1 or 2, or some other example herein, wherein when executed, the instructions are further to cause the apparatus to receive the first and second category data from one or more vehicles.

Example 4 includes the subject matter of any of examples 1-3, or some other example herein, wherein when executed, the instructions are further to cause the apparatus to determine, using the second inference model, whether the simulated response to the driving environment differs from the response to the driving environment by a human driver.

Example 5 includes the subject matter of any of examples 1-4, or some other example herein, wherein the apparatus comprises the autonomous driving simulator.

Example 6 includes the subject matter of any of examples 1-5, or some other example herein, wherein when executed, the instructions are further to cause the apparatus to receive at least the first category of data related to the driving environment in the geographic location; and generate the first inference model from the received data.

Example 7 is a method for automatically training a machine learning system for controlling a computer-assisted or autonomous driving (CA/AD) vehicle, comprising receiving data of a plurality of categories collected for a driving environment; generating, a first version of an inference model from the received data; identifying, from the inference model, a problem location; determining at least one additional category of data to collect to improve accuracy, for the problem location, of the inference model; receiving data collected for the at least one additional category; and generating a second version of the inference model adding data collected for the additional category.

Example 8 includes the subject matter of example 7, or some other example herein, further comprising collecting data on variable factors in the problem location.

Example 9 includes the subject matter of example 8, or some other example herein, wherein the data on variable factors comprises schedule information.

Example 10 includes the subject matter of any of examples 7-9, or some other example herein, further comprising dispatching one or more autonomous vehicles to the identified problem location to collect the at least one additional category of data.

Example 11 includes the subject matter of any of examples 7-10, or some other example herein, wherein identifying the problem location comprises comparing an expected vehicle behavior predicted by the inference model with human driver actions at the problem location.

Example 12 includes the subject matter of example 11, or some other example herein, further comprising creating a third version of the inference model from the second inference model and data on the human driver actions at the problem location.

Example 13 includes the subject matter of example 11 or 12, or some other example herein, further comprising receiving the expected vehicle behavior predicted by the inference model from an autonomous driving system simulator.

Example 14 includes the subject matter of example 13, or some other example herein, further comprising determining, using results received from the simulator using the second inference model, whether the problem location is still present.

Example 15 is an apparatus to navigate a computer-assisted or autonomous driving (CA/AD) vehicle, comprising a steering command generator, disposed in the CA/AD vehicle, to provide steering commands to the CA/AD vehicle based upon a first inference model and data received from one or more sensors; and a feedback collector, disposed in the CA/AD vehicle, to receive data on driver actions taken in response to the steering commands; wherein the apparatus, disposed in the CA/AD vehicle, is to transmit the data from the one or more sensors and the data on the driver actions to a remote server, and receive from the remote server a second inference model, the second inference model generated from the first inference model updated with the data from the one or more sensors and the data on the driver actions.

Example 16 includes the subject matter of example 15, or some other example herein, wherein the apparatus is part of a CA/AD vehicle driving system.

Example 17 includes the subject matter of example 15 or 16, or some other example herein, wherein the apparatus is part of a CA/AD vehicle.

Example 18 includes the subject matter of any of examples 15-17, or some other example herein, wherein the steering command generator is to further provide steering commands to the CA/AD vehicle based upon the second inference model.

Example 19 is a system for generating an inference model for a computer-assisted or autonomous driving (CA/AD) vehicle, comprising a reference model generator to generate a first inference model from a first category of data collected from a driving environment in a geographic location; and an autonomous driving simulator, in communication with the reference model generator, to validate the first inference model by comparing the simulator response to the first inference model with a human driver response to the driving environment, wherein the reference model generator is to generate a second inference model based upon the first inference model, the human driver response, and a second category of data collected from the driving environment.

Example 20 includes the subject matter of example 19, or some other example herein, wherein the reference model generator is to determine the second category of data to be collected from the driving environment.

Example 21 includes the subject matter of example 19 or 20, or some other example herein, wherein the reference model generator is to dispatch one or more CA/AD vehicles to the geographic location to gather the second category of data.

What is claimed is:

1. A non-transitory computer readable medium (CRM) containing instructions executable by a processor in an apparatus, that when executed cause the apparatus to:
determine, based on results obtained by processing real-world data acquired from a driving environment in a geographic location using one or more sensors equipped to a vehicle in a computer-assisted or autonomous driving (CA/AD) system simulator configured with a first inference model, whether a simulated CA/AD system response to the driving environment differs from a response to the driving environment by a human driver, the human driver response determined from one or more sensors equipped to a human-driven vehicle, the first inference model having been generated by a neural network based on at least a first category of data related to the driving environment; and
if the simulated response differs from the human driver response:
determine a second category of data to collect;
receive data in the second category; and
generate, with the neural network, a second inference model from at least the first inference model and the received data of the second category.

2. The CRM of claim 1, wherein when executed, the instructions are further to cause the apparatus to use the second inference model to guide a vehicle.

3. The CRM of claim 1, wherein when executed, the instructions are further to cause the apparatus to receive the first and second category data from one or more vehicles.

4. The CRM of claim 1, wherein when executed, the instructions are further to cause the apparatus to determine, using the second inference model, whether the simulated response to the driving environment differs from the response to the driving environment by a human driver.

5. The CRM of claim 1, wherein the apparatus comprises the autonomous driving simulator.

6. The CRM of claim 1, wherein when executed, the instructions are further to cause the apparatus to:
receive at least the first category of data related to the driving environment in the geographic location; and
generate the first inference model from the received data.

7. A method for automatically training a machine learning system for controlling a computer-assisted or autonomous driving (CA/AD) vehicle, comprising:
receiving, from one or more sensors equipped to a vehicle, data of a plurality of categories collected for a driving environment;
generating, using a neural network, a first version of an inference model from the received data;
identifying, from the inference model, a problem location by analyzing with the inference model real-world data acquired from one or more sensors equipped to a CA/AD vehicle;
determining at least one additional category of data to collect to improve accuracy, for the problem location, of the inference model;
receiving data collected for the at least one additional category; and
generating, using the neural network, a second version of the inference model adding data collected for the additional category.

8. The method of claim 7, further comprising collecting data on variable factors in the problem location.

9. The method of claim 8, wherein the data on variable factors comprises schedule information.

10. The method of claim 7, further comprising dispatching one or more autonomous vehicles to the identified problem location to collect the at least one additional category of data.

11. The method of claim 7, wherein identifying the problem location comprises comparing an expected vehicle behavior predicted by the inference model with human driver actions at the problem location.

12. The method of claim 11, further comprising creating a third version of the inference model from the second inference model and data on the human driver actions at the problem location.

13. The method of claim 11, further comprising receiving the expected vehicle behavior predicted by the inference model from an autonomous driving system simulator.

14. The method of claim 13, further comprising determining, using results received from the simulator using the second inference model, whether the problem location is still present.

15. An apparatus to navigate a computer-assisted or autonomous driving (CA/AD) vehicle, comprising:
a steering command generator, disposed in the CA/AD vehicle, to provide steering commands to the CA/AD vehicle based upon a first inference model generated by a neural network and data received from a first set of one or more sensors; and a feedback collector, disposed in the CA/AD vehicle, to receive data on driver actions taken in response to the steering commands, the data on driver actions acquired from a second set of one or more sensors;

wherein the apparatus, disposed in the CA/AD vehicle, is to:
  transmit the data from the first and second sets of one or more sensors to a remote server, and
  receive from the remote server a second inference model, the second inference model generated by the neural network from the first inference model updated with the data from the one or more sensors and the data on the driver actions.

16. The apparatus of claim 15, wherein the apparatus is part of a CA/AD vehicle driving system.

17. The apparatus of claim 15, wherein the apparatus is part of a CA/AD vehicle.

18. The apparatus of claim 15, wherein the steering command generator is to further provide steering commands to the CA/AD vehicle based upon the second inference model.

19. A system for generating an inference model for a computer-assisted or autonomous driving (CA/AD) vehicle, comprising:

a reference model generator to generate, using a neural network, a first inference model from a first category of data collected from one or more sensors equipped to a vehicle in a driving environment in a geographic location; and an autonomous driving simulator, in communication with the reference model generator, to validate the first inference model by comparing a simulator response to the first inference model with a human driver response to the driving environment, the human driver response determined from data from one or more sensors equipped to a human-driven vehicle, wherein the reference model generator is to generate, using the neural network, a second inference model based upon the first inference model, the human driver response, and a second category of data collected from the driving environment.

20. The system of claim 19, wherein the reference model generator is to determine the second category of data to be collected from the driving environment.

21. The system of claim 19, wherein the reference model generator is to dispatch one or more CA/AD vehicles to the geographic location to gather the second category of data.

* * * * *